(12) United States Patent
Song

(10) Patent No.: US 6,260,052 B1
(45) Date of Patent: Jul. 10, 2001

(54) DIGITAL SIGNAL PROCESSING APPARATUS AND METHOD THEREFOR

(75) Inventor: Young-ik Song, Suwon (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/222,822

(22) Filed: Dec. 30, 1998

(30) Foreign Application Priority Data

Dec. 30, 1997 (KR) .................................................. 97-77784

(51) Int. Cl.$^7$ ...................................................... G06F 17/10
(52) U.S. Cl. .............................................................. 708/300
(58) Field of Search ...................................... 708/300, 303, 708/305, 313, 315, 319, 403, 404, 405; 342/84, 99, 100, 101, 171

(56) References Cited

U.S. PATENT DOCUMENTS

| | | | |
|---|---|---|---|
| 4,914,441 | * | 4/1990 | Brookner ............................... 342/161 |
| 4,934,373 | * | 6/1990 | Angelsen et al. .................... 600/455 |
| 5,519,402 | * | 5/1996 | Kitayoshi ............................. 342/196 |
| 5,647,365 | | 7/1997 | Abboud . |
| 6,181,755 | * | 1/2001 | Junell ................................... 375/362 |

OTHER PUBLICATIONS

"A Programmable Pulsed Doppler Radar Signal Processor Implementation with DSP for Adaptability and Multi–Function" by Y. K. Kwag et al., Oct. 1992, pp. 379–382.
Radar,92 (*IEE Conference Publication No. 365*) pp. 379 to 382: YK Kwag et al.

\* cited by examiner

*Primary Examiner*—Chuong Dinh Ngo
(74) *Attorney, Agent, or Firm*—Robert E. Bushnell, Esq.

(57) ABSTRACT

A digital communications signal processing apparatus applied to digital radar signal processing and a method therefor are provided. The digital signal processing apparatus in which windowing, Doppler filtering and half phase filtering algorithms are successively performed, includes a storage portion for storing half phase filter coefficients, a first processor for processing windowing and half phase filtering according to a window weighting function using the coefficients stored in the storage portion, and a second processor for receiving an input signal and an output signal of the first processor and processing Doppler filtering.

20 Claims, 3 Drawing Sheets

DIGITAL SIGNAL PROCESSING APPARATUS AND METHOD THEREFOR

CLAIM OF PRIORITY

This application makes reference to, incorporates the same herein, and claims all benefits accruing under 35 U.S.C. §119 from an application entitled DIGITAL SIGNAL PROCESSING APPARATUS AND METHOD THEREOF earlier filed in the Korean Industrial Property Office on Dec. 30, 1997, and there duly assigned Serial No. 97- 77784, a copy of which is annexed hereto.

BACKGROUND OF THE INVENTION

1. Technical Field

The present invention relates to a digital communications signal processing apparatus applied to digital radar signal processing and a method therefor, and more particularly, to a digital signal processing apparatus in which windowing, Doppler filtering, and half phase filtering algorithms are successively performed, and a method therefor.

2. Related Art

The reason for using the windowing algorithm in digital signal processing and radar applications are to suppress Gibbs phenomenon generated due to discontinuity of signal data and to suppress generation of clutter signals.

One basic approach to designing a finite impulse response (FIR) digital filter is to first identify the infinite-duration impulse response by expanding the frequency response of an ideal filter in a Fourier series, and then to truncate and smooth this response using a window function. The most basic window is the rectangular window, where $W_r(n)$ can be shown as follows. $W_r(n)=1$ when $n>=-M$ and $n<=m$, and where $W_r(n)=0$ otherwise. The use of the rectangular window corresponds to a direct truncation of the infinite-duration impulse response and leads to a solution exhibiting large ripples before and after the discontinuity of the ideal frequency response. This is the well-known Gibbs phenomenon.

The Gibbs phenomenon can be explained by the fact that $H(\omega)$ is related to the ideal response $H_{id}(\omega)$) and the frequency response of the window function $$\Psi(\omega) = \sum_{n=-M}^{M} w[n]e^{-jn\omega} = w[0] + 2\sum_{n=1}^{M} w[n]\cos(n\omega) \quad (A)$$

through $$H(\omega) = \frac{1}{2\pi}\int_{-\pi}^{\pi} H_{id}(\theta)\Psi(\omega - \theta)d\theta \quad (B)$$

For the rectangular window, $$\Psi(\omega) = \sum_{n=-M}^{M} e^{-jn\omega} = \frac{\sin\left((2M+1)\frac{\omega}{2}\right)}{\sin\left(\frac{\omega}{2}\right)} \quad (C)$$

I have found that a load applied for calculation can be severe. I have also found that real-time processing of windowing, Doppler filter, and half phase filter algorithms cannot be implemented.

SUMMARY OF THE INVENTION

To solve the above problems, objects of the present invention are to provide a digital signal processing apparatus for enabling real-time processing by reducing operating load of filtering processing to successively perform windowing, Doppler filtering, and half phase filtering algorithms, and a method therefor.

Accordingly, to achieve the above objects, there is provided a digital signal processing apparatus in which windowing, Doppler filtering, and half phase filtering algorithms are successively performed, which includes a storage portion for storing half phase filter coefficients, a first processor for processing windowing and half phase filtering according to a window weighting function using the coefficients stored in the storage portion, and a second processor for receiving an input signal and an output signal of the first processor and processing Doppler filtering.

Also, there is provided a digital signal processing method by which windowing, Doppler filtering and half phase filtering algorithms are successively performed, including the steps of (a) storing half phase filter coefficients, (b) processing windowing and half phase filtering according to a window weighting function using the stored coefficients, and (c) receiving an input signal and the processed output signal and processing Doppler filtering.

To achieve these and other objects in accordance with the principles of the present invention, as embodied and broadly described, the present invention provides a digital signal processing apparatus in which windowing, Doppler filtering, and halfphase filtering algorithms are successively performed, comprising: a storage portion storing a plurality of coefficients; a first processor performing a windowing operation and a half phase filtering operation according to a window weighting function using said plurality of coefficients stored in said storage portion, and then outputting a first signal resulting from said windowing and half phase filtering operations; and a second processor receiving said first signal and also receiving a second signal, and performing a Doppler filtering operation and then outputting a third signal.

To achieve these and other objects in accordance with the principles of the present invention, as embodied and broadly described, the present invention provides a digital signal processing method by which windowing, Doppler filtering, and half phase filtering algorithms are successively performed, comprising: storing a plurality of coefficients; performing a windowing operation and a half phase filtering operation according to a window weighting function using said plurality of coefficients, and outputting a first signal resulting from said performing of said windowing and half phase filtering operations; and receiving said first signal and a second signal and executing Doppler filtering.

To achieve these and other objects in accordance with the principles of the present invention, as embodied and broadly described, the present invention provides an apparatus, comprising: a first digital signal processor performing a windowing operation and a half phase filtering operation according to a window weighting function utilizing a predetermined plurality of coefficients, and then outputting a first signal resulting from said windowing and half phase filtering operations; and a second digital signal processor receiving said first signal output from said first processor and also receiving a second signal, and then performing a Doppler filtering operation and outputting a third signal resulting from said Doppler filtering operation.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to exemplify the principles of this invention.

DESCRIPTION OF THE PREFERRED EMBODIMENTS

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 4:
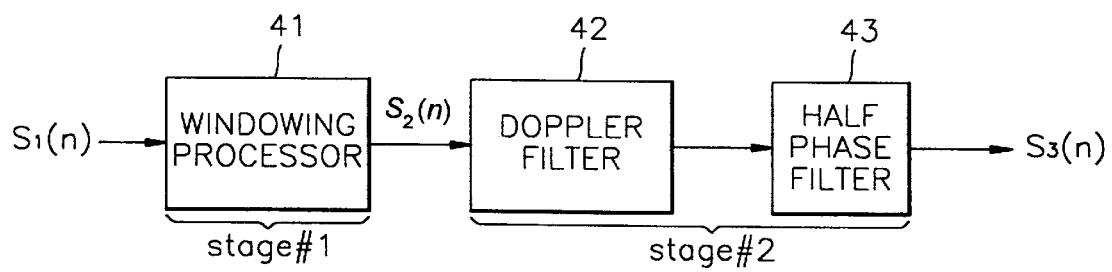
FIG. 4 is a schematic diagram of a digital signal processing apparatus.

FIG. 4 is a schematic diagram of a digital signal processing apparatus for continuously performing windowing, Doppler filtering, and half phase filtering algorithms. A windowing processor 41 receives an input signal $S_1(n)$ and performs an operation (stage #1) represented by the following equation (1). $S_2(n)$ is output from the windowing processor 41.

$$S_2(n) = S_1(n) * W_H(n) \quad (1)$$

where n=0, 1, 2, ..., N-1 and assuming that $W_H(n)$ is the Hamming weighting function, $W_H(n)$ can be written as $$W_H(n) = 0.54 - 0.46 * \cos((2*\pi*n)/(n-1)) \quad (2)$$

A Doppler filter 42 and a half phase filter 43 perform an operation represented by the following equation (3) to then output $S_3(n)$ (stage #2):

$$S_3(n) = \sum_{k=0}^{N-1} S_2(n) \text{Exp}(-j2\pi n * (k+0.5)/N), \quad (3)$$

$$n = 0, 1, \ldots, N-1$$

However, since there is a factor of 0.5 in an exponential term included in the equation for $S_3(n)$ due to the presence of the half phase filter 43, it is not possible to directly adopt fast Fourier transform (FFT) for calculating the equation (3). Also, load applied for calculation is severe. Thus, real-time processing of such algorithms cannot be implemented.

Hereinbelow, according to a preferred embodiment of the present invention will be described with reference to the accompanying drawings.

Figure 3:
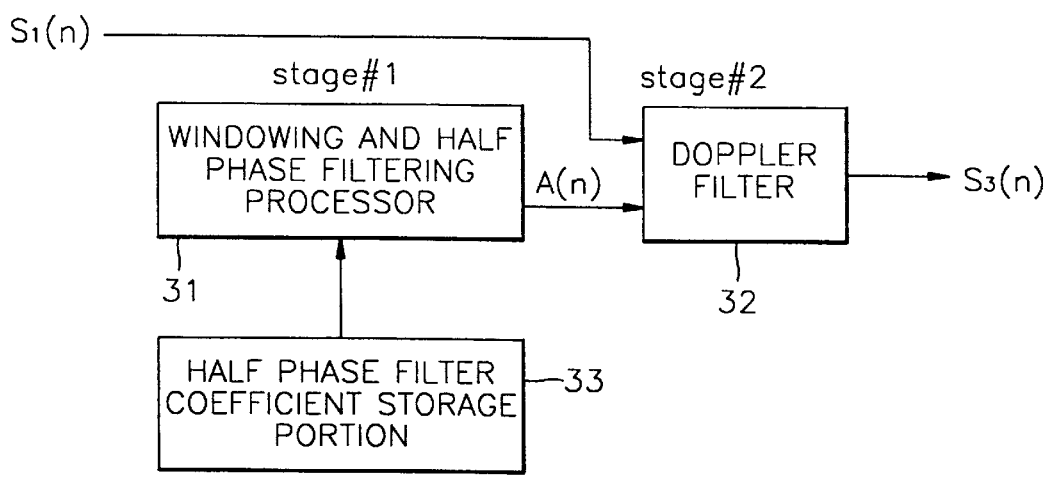
FIG. 3 is a schematic diagram illustrating digital signal processing algorithms, in accordance with the principles of the present invention.

In the present invention, the operation algorithms are changed, including calculation load for the half phase filtering in the stage #1, which was included in the stage #2 in FIG. 4. In accordance with the principles of the present invention, the half phase filtering is included in stage #1, as shown in FIG. 3. Thus, while the calculation load in the stage #1 is maintained to be the same, the half phase filtering operation is eliminated from the stage #2. Therefore, a hardware system operating in a real-time basis can be designed by reducing the calculation load in the stage #2.

Now, a windowing algorithm and Doppler filtering will first be described and then the configuration of the present invention will be described. There are essentially three well-known classes of design techniques for linear phase FIR filters-namely, the window method, the frequency sampling, and optical (in the Chebyshev sense) filter design methods. Hereinafter, the window method will be described in detail.

Since $H(e^{j\omega})$, the frequency response of any digital filter, is periodic in frequency, it can be expanded in a Fourier series as represented as the following equation (4). The resultant series is of the form $$H(e^{j\omega}) = \sum_{n=-\infty}^{\infty} h(n)e^{-j\omega n} \quad (4)$$

where the coefficient h(n) of the Fourier series is written as:

$$h(n) = \frac{1}{2\pi} \int_0^{2\pi} H(e^{j\omega})e^{j\omega n} d\omega \quad (5)$$

The coefficients h(n) of the Fourier series are easily recognized as being identical to the impulse response of a digital filter. There are two difficulties with the representation of Equation (4) for designing finite impulse response (FIR) filters. First, the filter impulse response is infinite in duration since the summation in Equation (4) extends to ±infinity (±∞). Second, the filter is unrealizable because the impulse response begins at −infinity (−∞); i.e., no finite amount of delay can make the impulse response realizable. Hence the filter resulting from a Fourier series representation $H(e^{j\omega})$ of is an unrealizable infinite impulse response (IIR) filter.

One possible way of obtaining a finite impulse response (FIR) filter that approximates $H(e^{j\omega})$ IQ, would be to truncate the infinite Fourier series at n=±M. Direct truncation of the series leads to the well-known Gibbs phenomenon, however which manifests itself as a fixed percentage overshoot and ripple before and after an approximated discontinuity in the frequency response. Thus, direct truncation is not a reasonable way of obtaining a finite impulse response (FIR) filter.

Figure 1A:
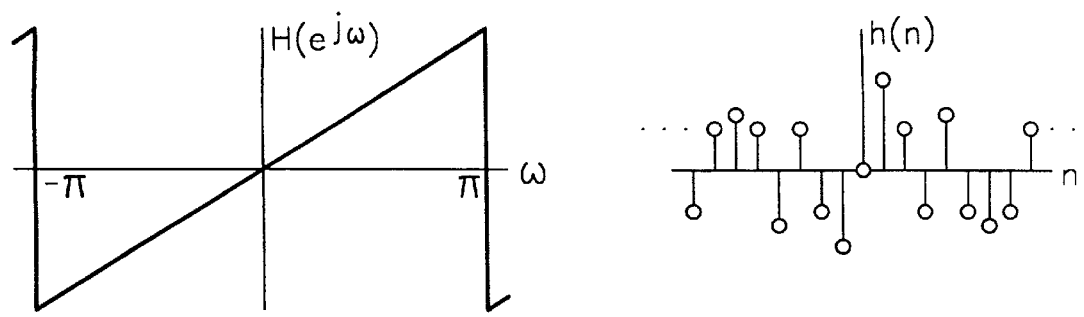
FIGS. 1A through 1D illustrate a windowing process.
Figure 1B:
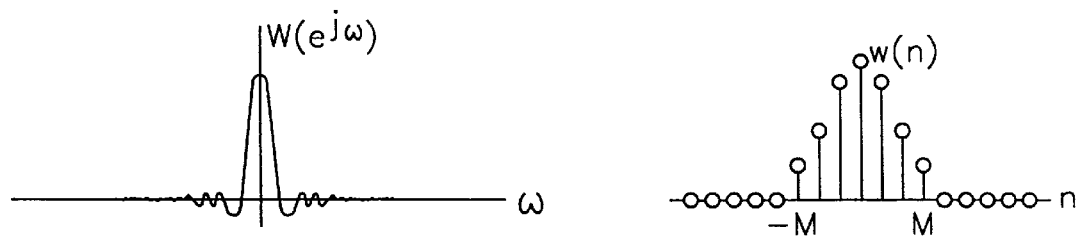
Figure 1C:
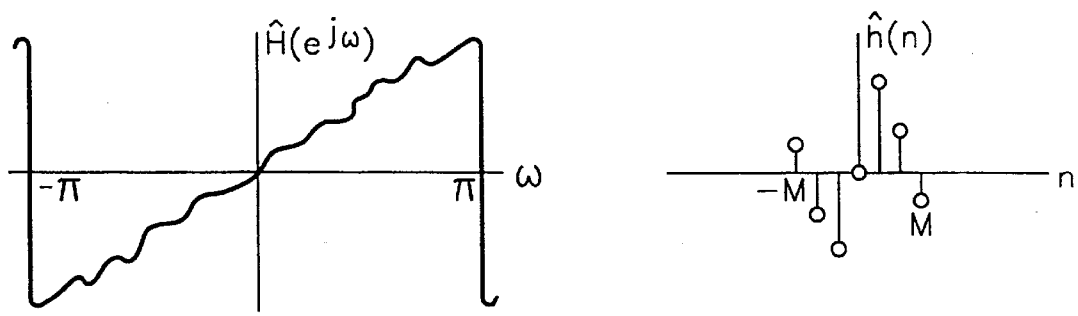
Figure 1D:
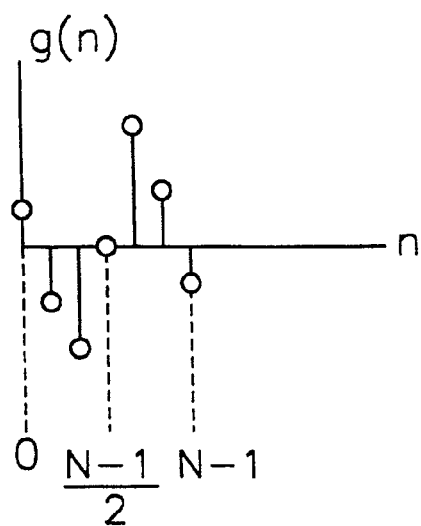

A more successful way of obtaining a finite impulse response (FIR) filter is to use a finite weighting sequence w(n), called a window, to modify the Fourier coefficients h(n) to control the convergence of the Fourier series. The technique of windowing is illustrated in FIGS. 1A through 1D. FIG. 1A shows the desired periodic frequency response $H(e^{j\omega})$ and its Fourier series coefficients h(n). FIG. 1B shows a finite duration weighting sequence w(n) with Fourier transform $W(e^{j\omega})$. $W(e^{j\omega})$, for most reasonable windows, consists of a central lobe which contains most of the energy of the window and side lobes which generally decay rapidly. To produce an FIR approximation to $H(e^{j\omega})$, the sequence $\hat{h}(n)=h(n)w(n)$ is formed. Outside the interval $-M<n<M, \hat{h}(n)$ is zero exactly. FIG. 1C shows $\hat{h}(n)$ and its Fourier transform $\hat{H}(e^{j\omega})$, which is readily seen to be the circular convolution of $H(e^{j\omega})$ and $W(e^{j\omega})$, since $\hat{h}(n)$ is the product of the sequences $\hat{h}(n)$ and w(n). FIG. 1D shows the realizable sequence g(n), which is a shifted version of $\hat{h}(n)$ and may be used as the desired filter impulse response.

As seen in the sample of FIGS. 1A to 1D, there are several noteworthy effects of windowing the Fourier coefficients of the filter on the resulting frequency response. A major effect is that discontinuities in $H(e^{j\omega})$ become transition bands between values on either side of the discontinuity. Since the final frequency response of the filter is the circular convolution of the ideal frequency response with the window's frequency response, it is clear that the width of these transition bands depends on the width of the main lobe of $W(e^{j\omega})$. A secondary effect of windowing is that ripple from the side lobes of $W(e^{j\omega})$ produces approximation errors (ripple in the resulting frequency response) for all $\omega$. Finally, since the filter frequency response is obtained via a convolution relation, it is clear that the resulting filters are never optimal in any sense, even though the windows may satisfy some reasonable optimality criterion.

The discussion above leads to the questions of what are desirable window characteristics and how closely are they attained in practice. Desirable window characteristics are:

1. Small width of main lobe of the frequency response of the window containing as much of the total energy as possible; and 2. Side lobes of the frequency response that decrease in energy rapidly as $\omega$ tends to $\pi$.

Figure 2:
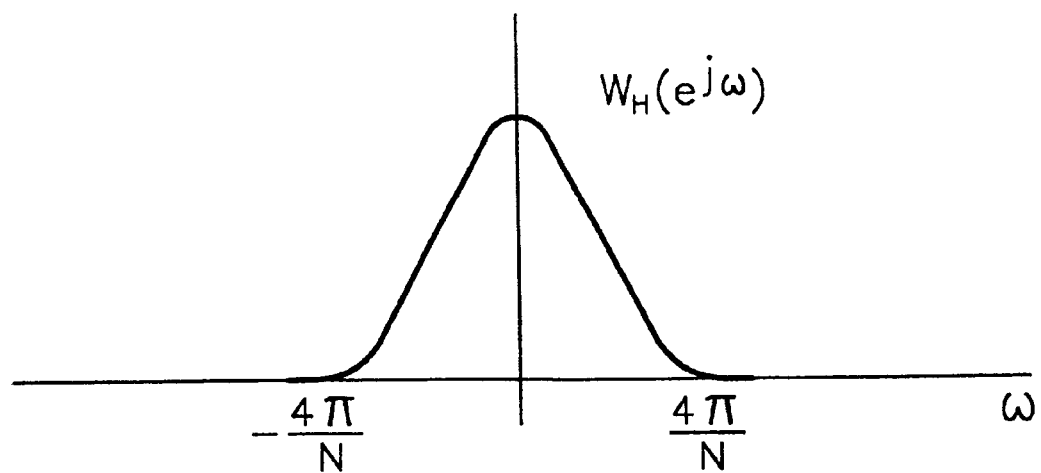
FIG. 2 illustrates a frequency response of a Hamming window, represented as $W_H(e^{j\omega})$.

There have been many windows such as the rectangular window, the "generalized" Hamming window, and the Kaiser window, proposed that approximate the desired characteristics. The generalized Hamming window is of the form $$W_H(n) = \alpha + (1-\alpha)\cos\left(\frac{2\pi n}{N}\right) \text{ for } -\left(\frac{N-1}{2}\right) \le n \le \frac{N-1}{2} \quad (6)$$
$$= 0 \quad \text{elsewhere}$$

where $\alpha$ is in the range $0 \le \alpha < 1.0$. If $\alpha = 0.54$, the window is called a Hamming window; if $\alpha = 0.5$, it is called a Hanning window. FIG. 2 shows a plot of the resulting frequency response of a Hamming window for $\alpha = 0.54$, N=25.

Next, Doppler filtering will be described. Doppler filtering of received target information is based on the Doppler effect. The use of Doppler is explained by examination of the equation (7):

$$\Delta f = \frac{2v}{c} f_0 = \frac{2v}{\lambda} \quad (7)$$

where $f_0$ is the carrier frequency, v is the target velocity, $\lambda$ is the wavelength (c+$f_0 \lambda$), and $\Delta f$ is the resultant shift in the received (relative to the transmitted) frequency. Equation (7) is the result when a continuous sine wave is transmitted for a constant velocity target. However, continuous signals would result in poor range resolution. To obtain both range and velocity resolution it becomes necessary to deal with pulsed Doppler signals. We shall now show that detection of such signals corresponding to sampling a sinusoid of frequency $\Delta f$ at the pulse repetition period; assume that each pulse of carrier frequency $f_0$ begins at exactly the same phase, then at some given range a return signal is received. Since, during the pulse durations, the aircraft can be considered stationary, there is no measurable Doppler shift of the received signal. After T seconds, however, the aircraft has moved slightly and if the next return is sampled at the same range, a phase shift relative to the first return is discernible. The amount of phase shift will be determined by the proportion of a wavelength moved during T; that is, $$\psi = 2\pi \frac{vT}{\lambda} \quad (8)$$

If the aircraft maintains constant radial velocity, there will be an additional phase shift $\Phi$ for each repetition interval T. Thus, any signal return from a given range can be represented as $$s(n,t) = a(n) e^{j[2\pi f_0(t-T) + n\psi]} \quad (9)$$

where a(n) is the amplitude modulation caused by the motion of the antenna beam as it sweeps by the target. For an electronically steerable antenna, it is possible to stop the antenna beam so that a(n) can be unity.

In the radar receiver, it is assumed that the returned complex exponential is multiplied by a coherent local oscillator source with an arbitrary but fixed phase $\psi$. Calling this signal $S_r(t)$, the demodulated result can be obtained as follows:

$$f(n,t) = s(n,t) s_r(t) \quad (10)$$
$$= a(n) e^{j[2\pi f_0(t-T) + n\psi]} e^{-j(2\pi f_0 t + \varphi)}$$
$$= a(n) e^{-j\omega_0 T} e^{-j\varphi} e^{-jn2\pi \frac{vT}{\lambda}}$$

the exponential $e^{-j\omega_0 T}$ and $e^{-j\Phi}$ are constants of unity amplitude and can be ignored. The variable part is simply an oscillation of frequency $v/\lambda$, which is the Doppler frequency.

FIG. 3 is a schematic diagram illustrating digital signal processing algorithm according to the present invention. If the windowing, Doppler filtering and half phase filtering algorithms are successively performed, an input signal $S_1(n)$ is received to perform window processing thereon to output a signal $S_2(n)$ represented as the equation (11):

$$S_2(n) = S_1(n) * W_H(n) \quad (11)$$

where n=0, 1, 2, . . ., N−1 and $W_H(n)$ is the Hamming weighting function represented as:

$$W_H(n) = 0.54 - 0.46 * \cos((2*T*n)/(n-1)) \quad (12)$$

Then, Doppler filtering and half phase filtering are performed to output $S_3(n)$ represented as:

$$S_3(n) = \sum_{k=0}^{N-1} S_2(n) \text{Exp}(-j2\pi n(k+0.5)/N) \quad (13)$$
$$= \sum_{k=0}^{N-1} S_1(n) W_H(n) \text{Exp}(-j2\pi n(k+0.5)/N)$$
$$= W_H(n) * \text{Exp}(j\pi n/N) \sum_{k=0}^{N-1} S_1(n) \text{Exp}(-jnk/N)$$
$$= A(n) \sum_{k=0}^{N-1} S_1(n) \text{Exp}(-j2\pi nk/N), n = 0, 1, \ldots, N-1$$

where $$A(n) = W_H(n) * \text{Exp}(-j\pi n/N) = (0.54 - 0.46 \cos(2\pi n/(N-1))) \text{Exp}(-j\pi N),$$
$$n=0, 1, 2, \ldots, N-1) \quad (14)$$

Thus, since the operation corresponding to half phase filtering represented by the following equation (15) is included in A(n), it is possible to separate the operation from the filtering processing.

$$Exp(-j\pi n/N), n=0, 1, 2 \ldots, N-1 \qquad (15)$$

In other words, prior to performance of the overall algorithms, the half phase filtering values are calculated to be stored in a memory device, and the operation of A(n) are performed using the stored values for windowing process. Then, in the next filtering process, only the operation for Doppler filtering is performed. In such a manner, since the operation load for the half phase filtering algorithm can be included in the multiplication load for window processing, calculation for half phase filtering is not necessary in the filtering process, thereby reducing the calculation load. Also, the Doppler filtering algorithm can be calculated by using a general fast Fourier transform (FFT).

Referring to FIG. 3, a half phase filter coefficient storage portion 33 stores half phase filter coefficients represented by the Equation (15) which is already calculated. A windowing and half phase filtering processor 31 calculates A(n) by the Equation (14) using the coefficients stored in the half phase filter coefficient storage portion 33 (stage #1). A Doppler filter 32 receives an input signal $S_1(n)$ and A(n) output from the windowing and halfphase filtering processor 31 and performs Doppler filtering as represented by the Equation (13) to output $S_3(n)$ (stage #2).

The present invention can be applied to a tracking radar signal processor and the like and is useful for development of real-time signal processing apparatus in which careful consideration must be taken into calculation load.

As described above, in the digital signal processing apparatus and method according to the present invention, the operation load for filtering processing is reduced in the digital signal processing in which windowing, Doppler filtering and half phase filtering algorithms must be successively performed, thereby enabling real-time processing. Also, according to the present invention, when N data pointers must be windowed and filtered in a real-time basis, since multiplications of N times are omitted, the amount of a hardware can be greatly reduced.

The symbol j represents the square root of minus one, an imaginary number. The j is an operator used in vector algebra computations for phase angle. The symbol ω represents angular velocity and is the equivalent of 2πf. The symbol f represents frequency, that is, the rate at which a phenomena is repeated. The basic unit of frequency is the hertz (Hz), which is one cycle per second. The symbol π represents the ratio c/d, where c is the circumference of a circle, and d is the diameter of that circle. π to the first 5 places is 3.14159. The formula Exp(-jπn/N) corresponds to an exponent. For example, if an integer 5 has an exponent of 3, represented as $5^3$, then the exponent 3 shows how many times 5 is to be multiplied by itself. Thus, $5^3=5\times5\times5=125$.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. A digital signal processing apparatus in which windowing, Doppler filtering, and half phase filtering algorithms are successively performed, comprising:

a storage portion storing a plurality of coefficients;

a first processor performing a windowing operation and a half phase filtering operation according to a window weighting function using said plurality of coefficients stored in said storage portion, and then outputting a first signal resulting from said windowing and half phase filtering operations; and a second processor receiving said first signal and also receiving a second signal, and performing a Doppler filtering operation and then outputting a third signal.

2. The apparatus of claim 1, wherein said plurality of coefficients is calculated by formula Exp(-jπn/N), whereas N corresponds to a first integer, each respective one of said plurality of coefficients being calculated with a respective integer value for n, wherein n>=0 and n<=(N-1).

3. The apparatus of claim 2, wherein a first coefficient of said plurality of coefficients is calculated with n being equal to 0.

4. The apparatus of claim 2, wherein a last coefficient of said plurality of coefficients is calculated with n being equal to (N-1).

5. The apparatus of claim 2, wherein said window weighting function corresponds to a window defined mathematically as:

$$W(n)=0.54-0.46 \cos((2\pi n)/(N-1)).$$

6. The apparatus of claim 1, wherein said plurality of coefficients correspond to a plurality of half phase filtering coefficients.

7. The apparatus of claim 1, wherein said first signal output from said first processor corresponds to a product of said plurality of coefficients and said window weighting function.

8. The apparatus of claim 1, wherein said window weighting function corresponds to a Hamming window defined mathematically as:

$$W_H(n)=0.54-(0.46 \cos((2\pi n)/(N-1))),$$

wherein N corresponds to a first integer and n corresponds to a second integer, and wherein n>=0 and n<=(N-1).

9. A digital signal processing method by which windowing, Doppler filtering, and half phase filtering algorithms are successively performed, comprising:

storing a plurality of coefficients;

performing a windowing operation and a halfphase filtering operation according to a window weighting function using said plurality of coefficients, and outputting a first signal resulting from said performing of said windowing and half phase filtering operations; and receiving said first signal and a second signal and executing Doppler filtering.

10. The method of claim 9, wherein said performing of said windowing and half phase filtering operations comprises a multiplying of said plurality of coefficients and said window weighting function.

11. The method of claim 9, wherein said plurality of coefficients correspond to a plurality of half phase filter coefficients.

12. The method of claim 9, wherein said plurality of coefficients is calculated by formula Exp(-jλn/N), whereas N corresponds to a first integer, each respective one of said plurality of coefficients being calculated with a respective integer value for n, wherein n>=0 and n<=(N−1).

13. The method of claim 12, wherein said window weighting function corresponds to a window defined mathematically as:

$$W(n)=0.54-0.46\cos((2\pi n)/(N-1)).$$

14. The method of claim 9, wherein said window weighting function corresponds to a Hamming window defined mathematically as:

$$W_H(n)=0.54-(0.46\cos((2\pi n)/(N-1))),$$

wherein N corresponds to a first integer and n corresponds to a second integer, and wherein n>=0 and n<=(N−1).

15. An apparatus, comprising:
a first digital signal processor performing a windowing operation and a half phase filtering operation according to a window weighting function utilizing a predetermined plurality of coefficients, and then outputting a first signal resulting from said windowing and halfphase filtering operations; and
a second digital signal processor receiving said first signal output from said first processor and also receiving a second signal, and then performing a Doppler filtering operation and outputting a third signal resulting from said Doppler filtering operation.

16. The apparatus of claim 15, wherein said windowing, halfphase filtering, and Doppler filtering operations are successively performed.

17. The apparatus of claim 15, wherein said plurality of coefficients is calculated by formula $\text{Exp}(-j\pi N)$, whereas N corresponds to a first integer, each respective one of said plurality of coefficients being calculated with a respective integer value for n, wherein n>=0 and n<=(N−1).

18. The apparatus of claim 17, wherein said window weighting function corresponds to a window defined mathematically as:

$$W(n)=0.54-0.46\cos((2\pi n)/(N-1)).$$

19. The apparatus of claim 15, wherein said first signal output from said first processor corresponds to a product of said plurality of coefficients and said window weighting function.

20. The apparatus of claim 15, wherein said window weighting function corresponds to a Hamming window defined mathematically as:

$$W_H(n)=0.54-(0.46\cos((2\pi n)/(N-1))),$$

wherein N corresponds to a first integer and n corresponds to a second integer, and wherein n>=0 and n<=(N−1).

* * * * *